United States Patent [19]

Crain et al.

[11] Patent Number: 4,460,821
[45] Date of Patent: Jul. 17, 1984

[54] INFRARED FURNACE WITH MUFFLE

[75] Inventors: N. Robert Crain, Huntington Beach; Robert P. Hardison, Cerritos, both of Calif.

[73] Assignee: Radiant Technology Corporation, Cerritos, Calif.

[21] Appl. No.: 381,901

[22] Filed: May 25, 1982

[51] Int. Cl.$^3$ .......................... A21B 2/00; F27B 9/08
[52] U.S. Cl. .................................. 219/388; 219/411; 432/152; 432/64
[58] Field of Search ............... 219/388, 354, 405, 411, 219/390, 400; 432/64, 65, 144, 152, 128, 147; 34/216

[56] References Cited

U.S. PATENT DOCUMENTS

| | | | |
|---|---|---|---|
| 3,086,764 | 4/1963 | Beck | 432/64 |
| 3,293,879 | 12/1966 | Van Eikeren | 432/64 |
| 3,415,503 | 12/1968 | Beck | 432/152 |
| 3,626,154 | 12/1971 | Reed | 219/354 |
| 3,982,887 | 9/1976 | Kendziora | 219/388 |
| 4,208,573 | 6/1980 | Risse | 219/390 |
| 4,321,031 | 3/1982 | Woodgate | 219/388 |

*Primary Examiner*—C. L. Albritton
*Assistant Examiner*—Teresa J. Walberg
*Attorney, Agent, or Firm*—Christie, Parker & Hale

[57] ABSTRACT

An infrared furnace has a firing chamber in which a source of infrared energy is disposed and an elongated envelope transparent to the infrared energy extending through the firing chamber. The envelope has first and second open ends outside the firing chamber. First and second baffle chambers surround the respective first and second ends of the envelope. A product conveyor travels through the furnace via the baffle chambers and the envelope. Gas flow is prevented from the exterior of the furnace into the baffle chambers and from the firing chamber into the baffle chambers. Non-atmospheric gas is supplied to the baffle chambers so as to create therein a superatmospheric pressure which prevents gas flow into the baffle chambers from the exterior of the furnace. The non-atmospheric gas is exhausted from one of the baffle chambers, thereby inducing flow of the non-atmospheric gas from the other baffle chamber through the envelope. A seal chamber is disposed between each baffle chamber and the firing chamber such that gas leakage from the seal chamber to the baffle chamber and to firing chamber occurs around the periphery of the envelope. A packing is compressed against the periphery of the envelope and the walls of the seal chamber to minimize such leakage and the seal chamber is pressurized with non-atmospheric gas to prevent gas flow from the firing chamber to the baffle chamber.

17 Claims, 4 Drawing Figures

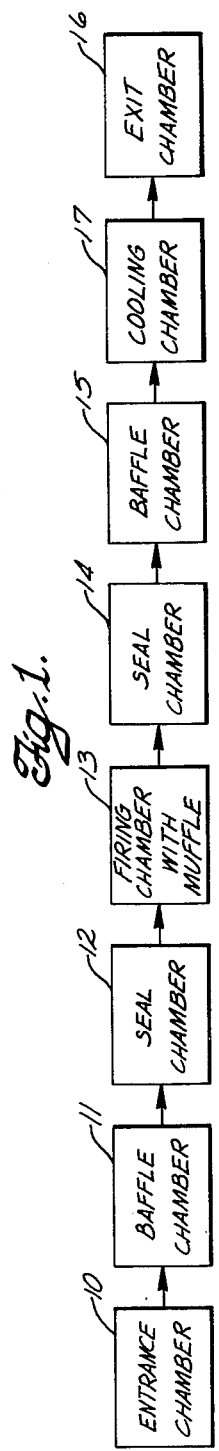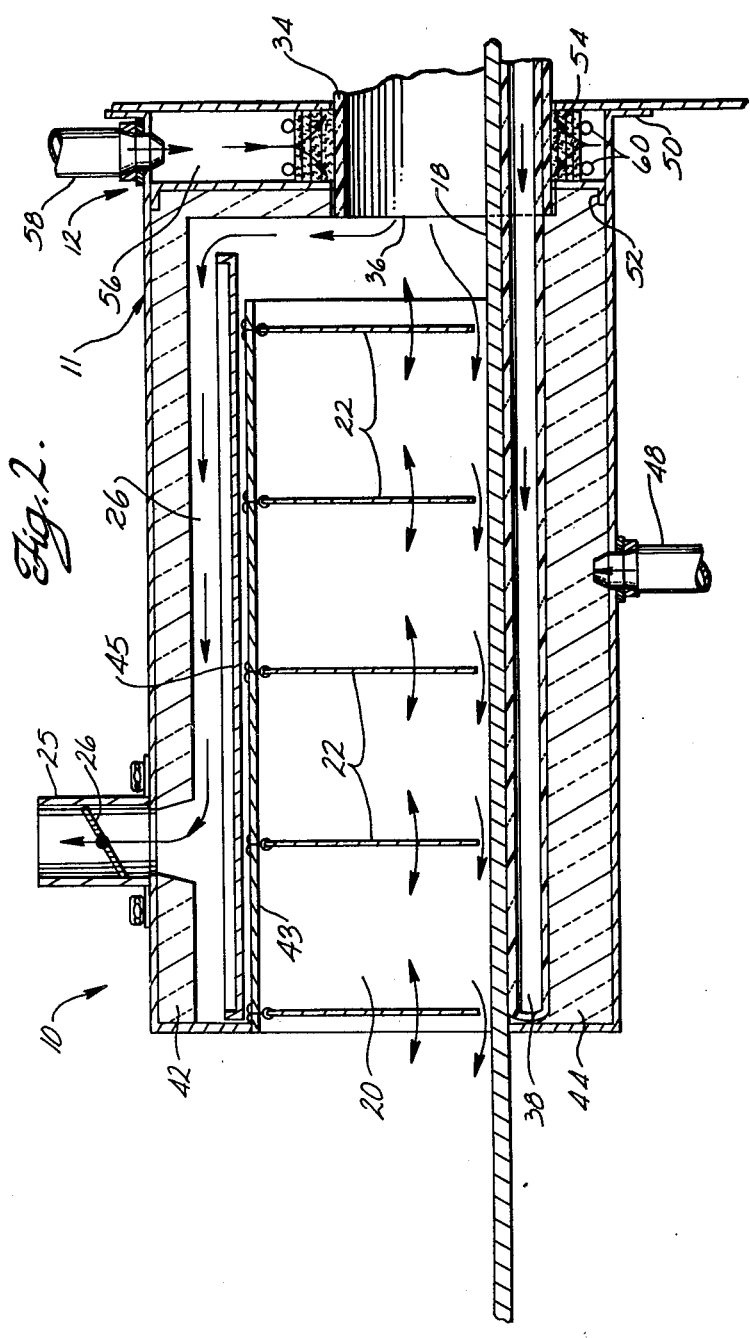

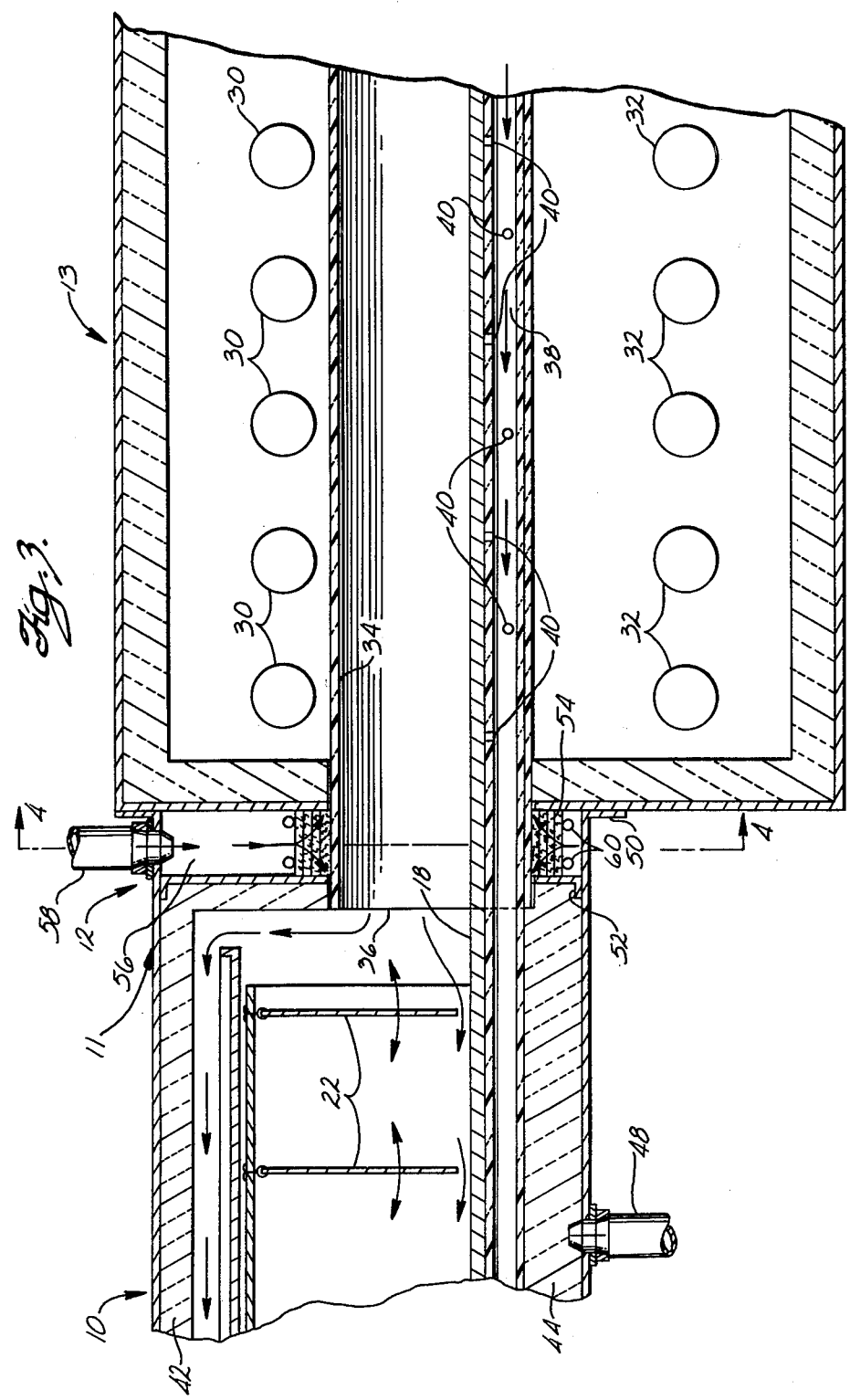

4,460,821

INFRARED FURNACE WITH MUFFLE

BACKGROUND OF THE INVENTION

This invention relates to infrared furnaces and, more particularly, to an infrared furnace suitable for firing electronic components in a non-reactive environment.

Application Ser. No. 306,200, filed Sept. 28, 1981, the disclosure of which is incorporated fully herein by reference, describes a method for firing thick film electronic circuits and an infrared furnace in which such method can be carried out. A plurality of infrared lamps are disposed in a firing chamber of the furnace such that the ends of the lamps extend through the walls of the firing chamber for electrical connection to a power source outside the furnace. The interface between the walls of the firing chamber and the lamps cannot be completely sealed from the atmosphere outside the furnace. As explained in this application, the described furnace very effectively fires thick film electronic circuits. Layers of a number of materials, such as Ruthenium oxide, silver, gold, glass, and dielectric can be fired in an atmospheric environment. In such case, the furnace described in the referenced application adequately controls the environment during component firing. Layers of other materials, such as copper, need to be fired in a non-atmospheric environment in order to prevent reaction, e.g., oxidation, of the material with the air. In such case, the furnace described in the referenced application is not totally satisfactory because atmospheric air can leak into the firing chamber, where it reacts with the material being fired.

SUMMARY OF THE INVENTION

According to the invention, an infrared furnace has a firing chamber in which an elongated envelope transparent to the infrared energy extends through the firing chamber and a source of infrared energy is disposed outside the envelope; The envelope has first and second open ends outside the firing chamber. First and second baffle chambers surround the respective first and second ends of the envelope. A product conveyor travels through the furnace via the baffle chambers and the envelope. Gas flow is prevented from the exterior of the furnace into the baffle chambers and from the firing chamber into the baffle chambers. Thus, products such as thick film circuits can be fired in a controlled environments, essentially in the absence of atmospheric air because atmospheric air is kept from the interior of the envelope where firing occurs.

Specifically, in the preferred embodiment, non-atmospheric gas is supplied to the baffle chambers so as to create therein a superatmospheric pressure which prevents gas flow into the baffle chambers from the exterior of the furnace. The non-atmospheric gas is exhausted from one of the baffle chambers, thereby inducing flow of the non-atmospheric gas from the other baffle chamber through the envelope. A seal chamber is disposed between each baffle chamber and the firing chamber such that gas leakage from the seal chamber to the baffle chamber and to firing chamber occurs around the periphery of the envelope. A packing is compressed against the periphery of the envelope and the walls of the seal chamber to minimize such leakage and the seal chamber in pressurized with non-atmospheric gas to prevent gas flow from the firing chamber to the baffle chamber.

A feature of the invention is the use of one or more hollow conveyor support rods to supply more non-atmospheric gas to the interior of the envelope.

BRIEF DESCRIPTION OF THE INVENTION

The features of a specific embodiment of the best mode contemplated of carrying out the invention are illustrated in the drawings, in which:

FIG. 1 is a schematic block diagram of an infrared furnace incorporating principles of the invention;

FIG. 2 is a side-sectional view of the entrance chamber, one of the baffle chambers, and one of the seal chambers;

FIG. 3 is a side-sectional view of one of the baffle chambers, one of the seal chambers, and part of the firing chamber.

DETAILED DESCRIPTION OF THE SPECIFIC EMBODIMENT

Figure 4:
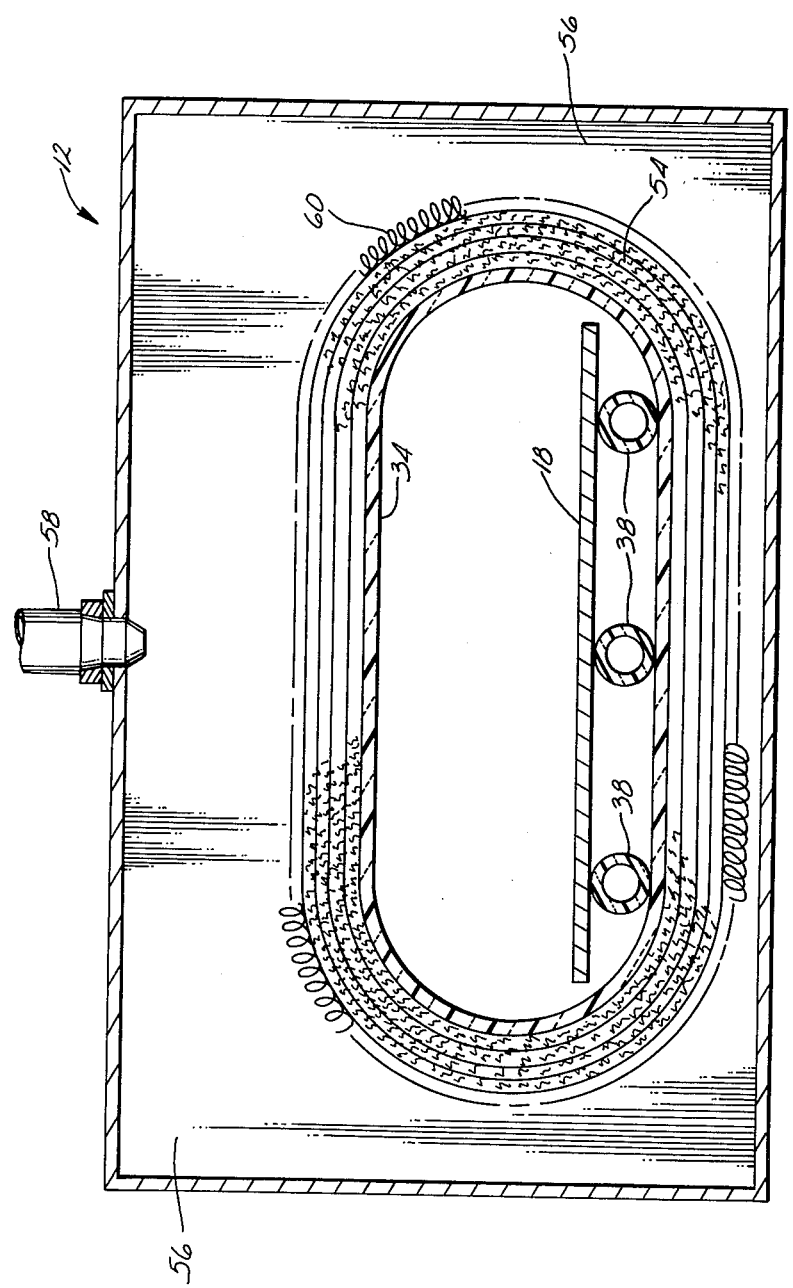
FIG. 4 is a sectional end view of one of the seal chambers taken through a plane designated 4—4 in FIG. 3.

With reference to FIG. 1, an infrared furnace incorporating principles of the invention comprises a plurality of interconnected chambers as follows: an entrance chamber 10 leading to a baffle chamber 11; a seal chamber 12 at the interface between baffle chamber 11 and a firing chamber 13 with muffle; a seal chamber 14 at the interface between firing chamber 13 and a baffle chamber 15; and an exit chamber 16 to which baffle chamber 15 is connected by a cooling chamber 17. As described in more detail below, a product conveyor constructed in the manner disclosed in the referenced application, travels through the described chambers including the muffle in firing chamber 13, which extends through seal chambers 12 and 14 into baffle chambers 11 and 15. The ends of the muffle, which are open, are surrounded by baffle chambers 11 and 15, respectively.

Entrance chamber 10, baffle chamber 11, and seal chamber 12 are shown in FIG. 2. A porous conveyor belt 18 travels through a horizontally elongated passage 20 through the furnace. Products to be fired, such as copper layers on thick film circuits, travel in carrier trays (not shown) through passage 20 from left to right on conveyor belt 18. Partitions 22 pivotally mounted on a horizontal bracket 43 serve to impede the flow of gas through passage 20 to the exterior of the furnace. As a carrier passes under a partition 22, it contacts the partition and pivots it in a counterclockwise direction as viewed in FIG. 2. Alternatively, stationary partitions having a clearance with respect to the carrier trays could be provided. Near the end of entrance chamber 10, a vertical upwardly extending exhaust duct 25 communicates with passage 20. A blower not shown in duct 25 draws gas out of passage 20. One or more dampers 26 serve to control the flow rate of exhaust gas passing through duct 25. Except for the absence of an exhaust duct, exit chamber 16 is the same as entrance chamber 10 and therefore is not shown in detail. A tray 45 extends horizontally across the full width of passage 20 under duct 25 to catch volatiles that may condense in passage 26 formed between tray 45 and the top of chamber 10. Tray 24 extends the full length of chamber 10 to chamber 11.

FIG. 3 shows baffle chamber 11, seal chamber 12, and part of firing chamber 13. A horizontal row of infrared lamps 30 and a horizontal row of infrared lamps 32 are mounted in firing chamber 13 in the manner disclosed in the referenced application so their ends extend outside firing chamber 13. Specifically, lamps 30 and 32 are disposed in firing chamber 13 such that their ends extend through the walls of firing chamber 13 for connection to an electrical power source outside the furnace. Lamp holders at the interface between the walls of the firing chamber and the lamps cannot adequately seal the interior of the firing chamber from the atmosphere to fire satisfactorily some materials such as for example, copper. The outer surface of the walls of baffle chamber 11, seal chamber 12, and firing chamber 13 are all preferably made of sheet metal as specified in the referenced application. A tubular muffle 34, which is a straight elongated envelope of fused silica quartz or other material transparent to the infrared energy radiated by lamps 30 and 32, extends through firing chamber 13 between lamps 30 and lamps 32. Muffle 34 has an open end 36 outside of firing chamber 13 which is surrounded by baffle chamber 11 and an open end not shown outside of firing chamber 13 which is surrounded by baffle chamber 15. As shown in FIG. 3, conveyor belt 18 passes through muffle 34. A plurality of hollow rods 38 underlie conveyor belt 18 throughout the furnace so as to provide support thereto. A portion of one or more of rods 38 within muffle 34 has holes 40 to provide communication between the interior of rods 38 and the exterior.

Firing chamber 13 is constructed in the manner disclosed in the referenced application. An insulative horizontally extending layer 42 covers the top of passage 20 throughout the length of chambers 10 and 11. A porous insulative horizontally extending layer 44 covers the bottom of passage 20 throughout the length of chambers 10 and 11. A non-atmospheric gas, preferably nitrogen, under pressure is supplied through a fitting 48 to layer 44, which has a series of channels not shown to facilitate gas distribution to all parts of layer 44. Nitrogen under pressure seeps through the pores of layer 44 to provide a low velocity non-atmospheric environment in passage 20 and around open end 36 of muffle 34. This nitrogen gas establishes a superatmospheric pressure around open end 36 of muffle 34. Gas thus flows slowly but continuously and unidirectionally toward exhaust duct 25, and to a lesser extent to the atmosphere through entrance chamber 10, thereby preventing gas flow in the other direction, i.e., toward open end 36 of muffle 34. This eliminates the possibility of contamination by atmospheric air.

Non-atmospheric gas, preferably nitrogen, is supplied to one or more of rods 38 to introduce such gas directly into the interior of muffle 34.

Gas can leak through the gaps around the periphery of muffle 34 at the interface with firing chamber 13 and the interface with baffle chamber 11. Seal chamber 12 is designed to minimize the amount and control the direction of this leakage flow. Specifically, seal chamber 12 is attached to firing chamber 13 by a sealed flange 50 and is attached to baffle chamber 11 by a sealed flange 52. A compressible packing 54 surrounds the periphery of muffle 34 within sealing chamber 12. Packing 54 is compressed against the periphery of muffle 34 and the side walls of seal chamber 12 adjacent to baffle 11 and firing chamber 13 so as to cover the leakage gaps around muffle 34. The space between packing 54 and the outer perimeter of seal chamber 12 defines an approximately annular plenum 56 to which non-atmospheric gas, preferably nitrogen under pressure, is supplied through a fitting 58.

An end-sectional view of seal chamber 12 is shown in FIG. 4. Preferably, packing 54 is made of silicon dioxide/aluminum dioxide fiber sold under the trade name Refrasil and is compressed by garter springs 60. The pressure in plenum 56 is higher than that in firing chamber 13 or the portion of baffle chamber 11 between partitions 42 and 44. Therefore, a slow continuous unidirectional flow of nitrogen takes place from seal chamber 12 through the leakage gaps to baffle chamber 11 and to firing chamber 13 thereby preventing gas flow from firing chamber 13 into baffle chamber 11.

The other end of firing chamber 13, seal chamber 14, and baffle chamber 15 are identical to baffle chamber 11, seal chamber 12, and the portion of firing chamber 13 shown in FIG. 3. A cooling chamber 17 not shown in detail, has means such as heat transfer fins for cooling the fired product to the desired temperature before leaving exit chamber 16.

In summary, a non-atmospheric gaseous environment is maintained around the product while being fired in chamber 13 because the product is protected by muffle 34 from air leaking into firing chamber 13 and the ends of muffle 34 are surrounded by baffle chambers 11 and 15; The direction of non-atmospheric gas flow is illustrated by the arrows in FIGS. 2 and 3. Infrared energy from sources 30 and 32 passes through the walls of muffle 34 to impinge upon and heat the product passing therethrough on conveyor belt 18. Within muffle 34 an essentially pure nitrogen environment is maintained. Specifically, the leakage of air from firing chamber 13 into the ends of muffle 34 is prevented by seal chamber 12. The leakage of air into the ends of muffle 34 through entrance chamber 10 and exit chamber 16 are prevented by baffle chamber 11 and baffle chamber 15, respectively. A continuous slow unidirectional flow of nitrogen takes place through muffle 34 in a direction counter to conveyor belt 18 by virtue of the position of exhaust duct 26. As a result of the non-atmospheric environment, undesired chemical reaction between the layer being fired and air can be avoided.

The described embodiment of the invention is only considered to be preferred and illustrative of the inventive concept; the scope of the invention is not to be restricted to such embodiment. Various and numerous other arrangements may be devised by one skilled in the art without departing from the spirit and scope of this invention. For example, instead of nitrogen, other non-atmospheric gases can be employed depending upon the material being fired. Under circumstances, one or more of the described chambers can be eliminated from the furnace; the exhaust duct could be eliminated or repositioned or a second exhaust duct could be provided at the other end of the firing chamber or direct introduction of gas into the muffle could be eliminated.

What is claimed is:

1. An infrared furnace comprising:
   a firing chamber;
   an elongated envelope transparent to infrared energy extending through the firing chamber, the envelope having first and second open ends outside the firing chamber;
   first and second baffle chambers surrounding the respective first and second ends of the envelope;
   a source of infrared energy in the firing chamber outside the envelope;
   a product conveyor traveling through the furnace via the baffle chambers and the envelope;

first means for preventing gas flow from exterior of the furnace into the baffle chambers; and second means for preventing gas flow from the region of the firing chamber outside the envelope into the baffle chambers, the second flow-preventing means comprising a seal chamber disposed between each baffle chamber and the firing chamber and means for inducing unidirectional, continuous flow of a non-atmospheric gas from the seal chamber to the region of the firing chamber outside the envelope.

2. The furnace of claim 1, in which the seal chamber has a common wall with the baffle chamber, a common wall with the firing chamber, and gaps between the respective common walls and the envelope, the second flow-preventing means additionally comprising a compressible packing around the envelope in the seal chamber, means for compressing the packing against the periphery of the envelope and the common walls, and means for introducing non-atmospheric gas under pressure into the seal chamber at a pressure higher than that in the firing chamber and the baffle chambers.

3. The furnace of claim 2, in which the first flow preventing means comprises means for supplying to the region of the baffle chambers adjacent to the first and second ends of the envelope non-atmospheric gas at super atmospheric pressure and low velocity to induce unidirectional, continuous flow of such non-atmospheric gas from the baffle chambers to the exterior of the furnace.

4. The furance of claim 3, additionally comprising means for exhausting the non-atmospheric gas from one, and only one, of the baffle chambers, thereby inducing flow of the non-atmospheric gas from the other baffle chamber through the envelope.

5. The furnace of claim 4, additionally comprising a hollow rod supporting the product conveyor in the envelope, openings formed in the member within the envelope, and means for supplying non-atmospheric gas under pressure to the interior of the envelope through the openings in the rod.

6. The furnace of claim 1, in which the source of infrared energy comprises a plurality of elongated infrared lamps mounted in the firing chamber so their ends extend outside the firing chamber.

7. The furnace of claim 6, in which the seal chamber has a common wall with the baffle chamber, a common wall with the firing chamber, and gaps between the respective common walls and the envelope, the second flow-preventing means additionally comprising a compressible packing around the envelope in the seal chamber, means for compressing the packing against the periphery of the envelope and the common walls to seal the gaps, and means for introducing non-atmospheric gas under pressure into the seal chamber at a pressure higher than that in the firing chamber and the baffle chambers.

8. The furnace of claim 7, in which the first flow-preventing means comprises means for supplying to the region of the baffle chambers adjacent to the first and second ends of the envelope non-atmospheric gas at super atmospheric pressure and low velocity to induce unidirectional, continuous flow of such non-atmospheric gas from the baffle chambers to the exterior of the furnace.

9. The furnace of claim 8, additionally comprising means for exhausting the non-atmospheric gas from one, and only one, of the baffle chambers, thereby inducing flow of the non-atmospheric gas from the other baffle chamber through the envelope.

10. An infrared furnace comprising:
a hollow tubular muffle having an entrance and an exit, the muffle being transparent to infrared energy;
a firing chamber surrounding the tubular muffle such that the entrance and exit of the muffle lie outside the firing chamber with an entrance gap and an exit gap between the muffle and the firing chamber;
a plurality of infrared lamps disposed in the firing chamber outside the muffle such that the ends of the lamps extend through the firing chamber to exterior of the furnace;
a first baffle chamber enclosing the entrance of the muffle and interfacing with the firing chamber at the entrance gap;
a second baffle chamber enclosing the exit of the muffle and interfacing with the firing chamber at the exit gap;
an entrance chamber coupling the exterior of the furnace to the first baffle chamber;
an exit chamber coupling the second baffle chamber to the exterior of the furnace;
means for transporting product through the muffle from entrance to exit thereof via the chambers;
a source of non-atmospheric gas;
means for supplying gas from the source to the baffle chambers so as to prevent the flow of atmospheric gas into the baffle chambers from the entrance and exit chambers; and
means for sealing the gap at the interface between each baffle chamber and the firing chamber.

11. The furnace of claim 10, in which the first baffle chamber and the firing chamber both have outer walls made of sheet metal interfacing with a sealed flange.

12. The furnace of claim 11, in which the means for sealing the gap at the interface between the first baffle chamber and the firing chamber comprises a seal chamber between the first baffle chamber and the firing chamber, the seal chamber having a common wall with the baffle chamber and a common wall with the firing chamber such that the entrance gap is formed between the common walls and the muffle, and means for introducing non-atmospheric gas under pressure into the seal chamber at a pressure higher than that in the firing chamber and the first baffle chamber.

13. The furnace of claim 12, in which the means for sealing the gap at the interface between the first baffle chamber and the firing chamber additionally comprises a compressible packing around the muffle in the seal chamber filling the entrance gap and means for compressing the packing against the periphery of the muffle and the common walls.

14. The furnace of claim 13, in which the common wall of the seal chamber with the first baffle chamber is sheet metal and is attached to the sheet metal wall of the first baffle chamber by a sealed flange.

15. The furnace of claim 14, additionally comprising means for exhausting the non-atmospheric gas from one and only one of the baffle chambers, thereby inducing flow of the non-atmospheric gas from the other baffle chamber through the muffle.

16. The furnace of claim 15, in which the one baffle chamber is the first baffle chamber and the other baffle chamber is the second baffle chamber.

17. The furnace of claim 10, additionally comprising means for exhausting the non-atmospheric gas from one and only one of the baffle chambers, thereby inducing flow of the non-atmospheric gas from the other baffle chamber through the muffle.

* * * * *